United States Patent
Tang

(10) Patent No.: US 9,250,662 B2
(45) Date of Patent: Feb. 2, 2016

(54) HOLDING FRAME AND HOUSING ASSEMBLY FOR ELECTRONIC DEVICE

(71) Applicants: Gigazone International Co., Ltd., New Taipei (TW); Giga-Byte Technology Co., Ltd., New Taipei (TW)

(72) Inventor: Dong Jie Tang, New Taipei (TW)

(73) Assignees: GIGAZONE INTERNTIONAL CO., LTD., New Taipei (TW); GIGA-BYTE TECHNOLOGY CO., LTD., New Taipei (TW)

( * ) Notice: Subject to any disclaimer, the term of this patent is extended or adjusted under 35 U.S.C. 154(b) by 73 days.

(21) Appl. No.: 14/188,779

(22) Filed: Feb. 25, 2014

(65) Prior Publication Data

US 2015/0138705 A1    May 21, 2015

(30) Foreign Application Priority Data

Nov. 18, 2013 (TW) .............................. 102221509 U

(51) Int. Cl.
G06F 1/18 (2006.01)
H05K 5/00 (2006.01)
H05K 5/02 (2006.01)
H05K 5/03 (2006.01)

(52) U.S. Cl.
CPC .............. *G06F 1/184* (2013.01); *H05K 5/0008* (2013.01); *H05K 5/0217* (2013.01); *H05K 5/0247* (2013.01); *H05K 5/03* (2013.01)

(58) Field of Classification Search
CPC .................. H01R 13/62938; H01R 13/62955; H01R 13/62933; H01R 13/62905; H01R 23/7005; G06F 1/184; G06F 1/1656; G06F 1/187; G06F 1/185; G06F 1/186
USPC ......................................... 439/157
See application file for complete search history.

(56) References Cited

U.S. PATENT DOCUMENTS

| | | | | |
|---|---|---|---|---|
| 6,023,415 A * | 2/2000 | Mayer et al. | ................... | 361/816 |
| 6,113,402 A * | 9/2000 | Joo | ................ | 439/157 |
| 6,580,616 B2 * | 6/2003 | Greenside et al. | ............ | 361/752 |
| 6,611,433 B1 * | 8/2003 | Lee et al. | ...................... | 361/736 |
| 6,618,262 B1 * | 9/2003 | Ta | ................ | 361/759 |
| 6,964,581 B2 * | 11/2005 | Chen et al. | .................... | 439/547 |
| 7,161,093 B1 * | 1/2007 | Hsieh et al. | ................... | 174/535 |
| 7,215,556 B2 * | 5/2007 | Wrycraft | ...................... | 361/802 |
| 7,298,609 B2 * | 11/2007 | Jeong | ........................ | 361/679.55 |
| 7,364,447 B1 * | 4/2008 | Desrosiers et al. | ........... | 439/157 |
| 7,684,209 B2 * | 3/2010 | Roesner | ........................ | 361/798 |
| 7,913,379 B2 * | 3/2011 | Bodenweber et al. | .......... | 29/739 |
| 8,369,098 B2 * | 2/2013 | Huang | ........................ | 361/756 |

(Continued)

*Primary Examiner* — Hoa C Nguyen
*Assistant Examiner* — Xanthia C Cunningham
(74) *Attorney, Agent, or Firm* — Chun-Ming Shih

(57) ABSTRACT

A holding frame and a housing assembly for an electronic device. The holding frame is used to hold a motherboard and at least one peripheral device. The holding frame includes a main holder, a linkage member, and a rotational holder. The motherboard is mounted onto the main holder via the linkage member. The peripheral device is mounted onto the rotational holder. The rotational holder is pivoted to the main holder to rotate on the main holder. The installation of the motherboard or the peripheral device will not be interfered by the structure of the holding frame. The housing assembly includes a case body and the holding frame. The holding frame is disposed within the case body. The installation of mounting the motherboard and the peripheral device onto the holding frame can be performed outside the case body without being interfered by the case body.

17 Claims, 14 Drawing Sheets

(56) References Cited

U.S. PATENT DOCUMENTS

| | | | |
|---|---|---|---|
| 8,908,388 B2* | 12/2014 | Chen | 361/802 |
| 8,947,884 B1* | 2/2015 | Grimm et al. | 361/752 |
| 2004/0125576 A1* | 7/2004 | Lin et al. | 361/759 |
| 2005/0118847 A1* | 6/2005 | Barringer et al. | 439/157 |
| 2005/0155781 A1* | 7/2005 | Kao et al. | 174/50 |
| 2005/0231923 A1* | 10/2005 | Peng et al. | 361/754 |
| 2006/0044776 A1* | 3/2006 | Xu | 361/803 |
| 2006/0139890 A1* | 6/2006 | Liu | 361/719 |
| 2009/0225527 A1* | 9/2009 | Olesiewicz et al. | 361/802 |
| 2012/0020016 A1* | 1/2012 | Cheng | 361/679.48 |
| 2013/0021742 A1* | 1/2013 | Lee et al. | 361/679.32 |

* cited by examiner

HOLDING FRAME AND HOUSING ASSEMBLY FOR ELECTRONIC DEVICE

BACKGROUND

1. Technical Field

The disclosure relates to housing assembly, and more particularly, to a holding frame and a housing assembly for electronic device.

2. Related Art

Generally, a computer apparatus is equipped with a frame structure disposed within a case body of the computer apparatus. Computer parts, such as hard disk drivers or motherboards, are usually mounted onto this frame structure. As mounting or un-mounting the computer parts, the frame structure always interferes with the mounting or un-mounting process. Therefore, the frame structure or the case body size usually makes the user difficult to install or uninstall the computer parts.

SUMMARY

In view of the above-mentioned problem, this disclosure discloses a housing assembly equipped with a detachable holding frame to solve the problem that the frame structure interferes with the mounting or un-mounting process for the computer parts.

A holding frame according to one or more embodiments of this disclosure is use to hold a motherboard, wherein plural electronic components are disposed on the motherboard. The holding frame includes a main holder and at least one linkage member. The main holder is used to hold the motherboard. The linkage member is detachably disposed on the main holder, for mounting the motherboard onto the main holder.

In one or more embodiments, the main holder includes a supporting portion, a first extending portion, and a second extending portion. The first extending portion and the second extending portion are respectively disposed on two opposite edges of the supporting portion in a protruding manner. The linkage member is detachably disposed to the first extending portion or the supporting portion.

In one or more embodiments, the linkage member includes a sleeve and a fixing pillar. The sleeve is sleeved on the first extending portion. The fixing pillar is detachably disposed on the supporting portion.

In one or more embodiments, the linkage member is a bolting structure, detachably disposed on the supporting portion.

In one or more embodiments, the main holder further includes a plurality of fixing members, disposed on the second extending portion for mounting a power module.

In one or more embodiments, the holding frame further includes a rotational holder. The rotational holder is pivoted to the main holder to rotate on the main holder.

In one or more embodiments, the rotational holder includes a first pivoting portion, a second pivoting portion, and a holding portion. The first pivoting portion and the second pivoting portion are respectively connected to two ends of the holding portion. The first pivoting portion and the second pivoting portion are respectively pivoted to the main holder to rotate on the main holder.

In one or more embodiments, the holding portion includes a first holding section, a second holding section, and a conjunction section. The conjunction section connects the first holding section to the second holding section. The conjunction section is bent, such that the conjunction section and the first holding section define a first concave accommodating space, and the first concave accommodating space is located on an outer side of the rotational holder; the conjunction section and the second holding section define a second concave accommodating space, and the second concave accommodating space is located on an inner side of the rotational holder. The first concave accommodating space or the second concave accommodating space is used to receive a peripheral device, and the peripheral device is electrically connects to the motherboard via a cable.

In one or more embodiments, the holding frame further includes an electrical connector, disposed to one side of the holding portion of the rotational holder. The peripheral device on the rotational holder is electrically connected to the electrical connector.

In one or more embodiments, the rotational holder further includes a plurality of through holes disposed on the holding portion for fixing the peripheral device by the fixing members passing through the through hole and engaging the peripheral device.

A housing assembly according to one or more embodiments of the disclosure includes a case body and a holding frame. The holding frame is use to hold a motherboard. The holding frame includes a main holder and a linkage member. The main holder is used to hold the motherboard. The linkage member is detachably disposed on the main holder, for mounting the motherboard onto the main holder.

In one or more embodiments, the case body includes a lateral plate, a base, and a hinge. The hinge is disposed at one edge of the lateral plate. The lateral plate is pivoted to the base via the hinge. Therefore, the lateral plate is able to rotate on the base.

In one or more embodiments, the main holder includes a supporting portion, a first extending portion, and a second extending portion. The first extending portion and the second extending portion are respectively disposed on two opposite edges of the supporting portion in a protruding manner. The linkage member is detachably disposed to first extending portion or the supporting portion.

In one or more embodiments, the linkage member includes a sleeve and a fixing pillar. The sleeve is movably sleeved on the first extending portion. The fixing pillar is detachably disposed on the supporting portion.

In one or more embodiments, the linkage member is a bolting structure, detachably disposed on the supporting portion.

In one or more embodiments, the main holder further includes a plurality of fixing members, disposed on the second extending portion for mounting a power module.

In one or more embodiments, the holding frame further includes a rotational holder. The rotational holder is pivoted to the main holder to rotate on the main holder.

In one or more embodiments, the rotational holder includes a first pivoting portion, a second pivoting portion, and a holding portion. The first pivoting portion and the second pivoting portion are respectively connected to two ends of the holding portion. The first pivoting portion and the second pivoting portion are respectively pivoted to the main holder to rotate on the main holder.

In one or more embodiments, the holding portion includes a first holding section, a second holding section, and a conjunction section. The conjunction section connects the first holding section to the second holding section. The conjunction section is bent, such that the conjunction section and the first holding section define a first concave accommodating space, and the first concave accommodating space is located on an outer side of the rotational holder; the conjunction section and the second holding section define a second concave accommodating space, and the second concave accommodating space is located on an inner side of the rotational holder. The first concave accommodating space or the second concave accommodating space is used to disposed a peripheral device therein, and the peripheral device is electrically connects to the motherboard via a cable.

In one or more embodiments, the rotational holder further includes an electrical connector, disposed on one side of the holding portion. The peripheral device on the rotational holder is electrically connected to the electrical connector.

In one or more embodiments, the rotational holder further includes a plurality of through holes disposed on the holding portion for fixing peripheral device by the fixing members passing through the through hole and engaging the peripheral device.

Through one or more linkage members, the user can easily mounts the motherboard 9, the power module, etc. to the holding frame and then place the holding frame into the case body. By the rotational movement of the rotational holder, the holding frame for mounting the computer parts (such as the motherboard) will not interfere with the installation of these computer parts. Furthermore, since the peripheral device is mounted onto the rotational holder, the peripheral device can be easily mounted onto or un-mounted from the rotational holder.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
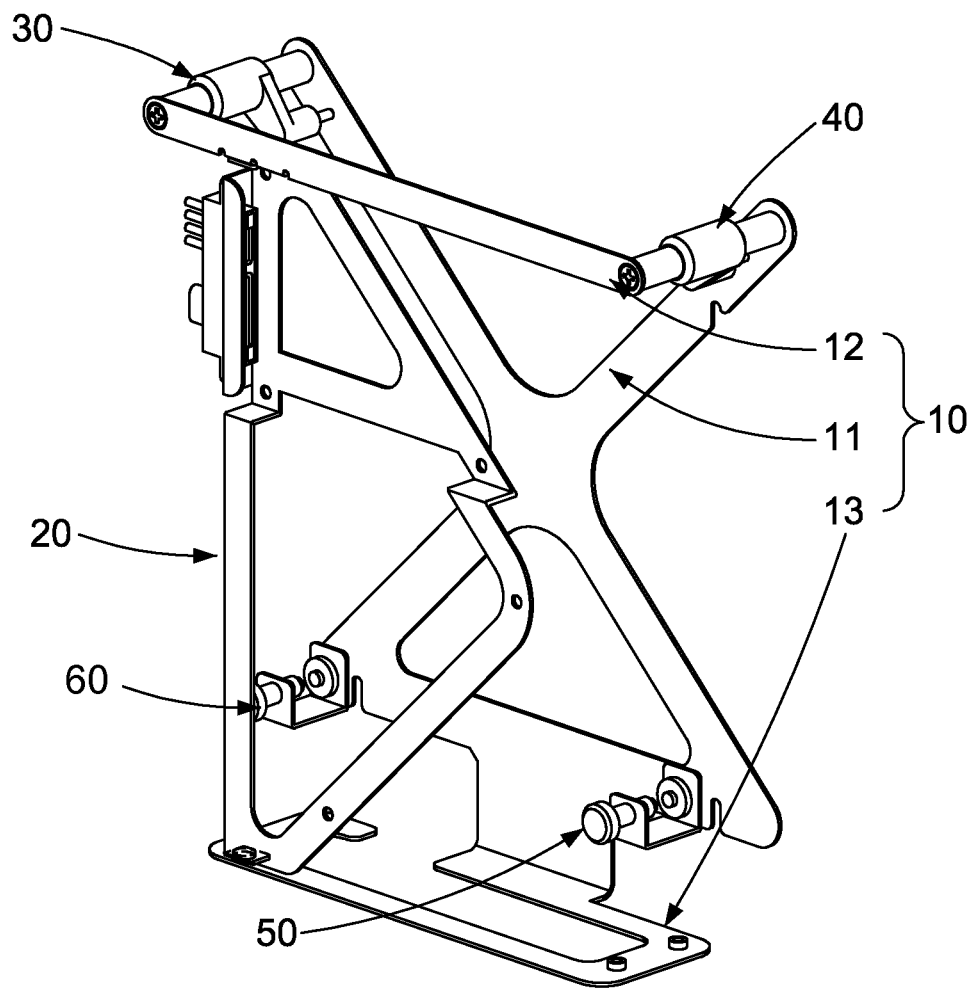
FIG. 1 is a three-dimensional view of a holding frame according to a first embodiment.

Referring to FIG. 1, in which a holding frame 1 according to a first embodiment includes a main holder 10, four linkage members 30, 40, 50, 60, and a rotational holder 20. The holding frame 1 can be equipped with one single linkage member or plural linkage members as long as the motherboard 9 is firmly mounted onto the holding frame 1.

The main holder 10 is used to hold the motherboard 9. The main holder 10 includes a supporting portion 11, a first extending portion 12, and a second extending portion 13. The first extending portion 12 and the second extending portion 13 are respectively disposed on two opposite edges of the supporting portion 11 in a vertically protruding manner. Two of the linkage members 30 and 40 are detachably disposed to the first extending portion 12 or the supporting portion 11 for mounting the motherboard 9 on the main holder 10. The other two linkage members 50, 60 are detachably disposed to the supporting portion 13 for mounting the motherboard 9 on the main holder 10.

Two ends of the rotational holder 20 are respectively pivoted to the first extending portion 12 and the second extending portion 13 of the main holder 10.

Figure 2:
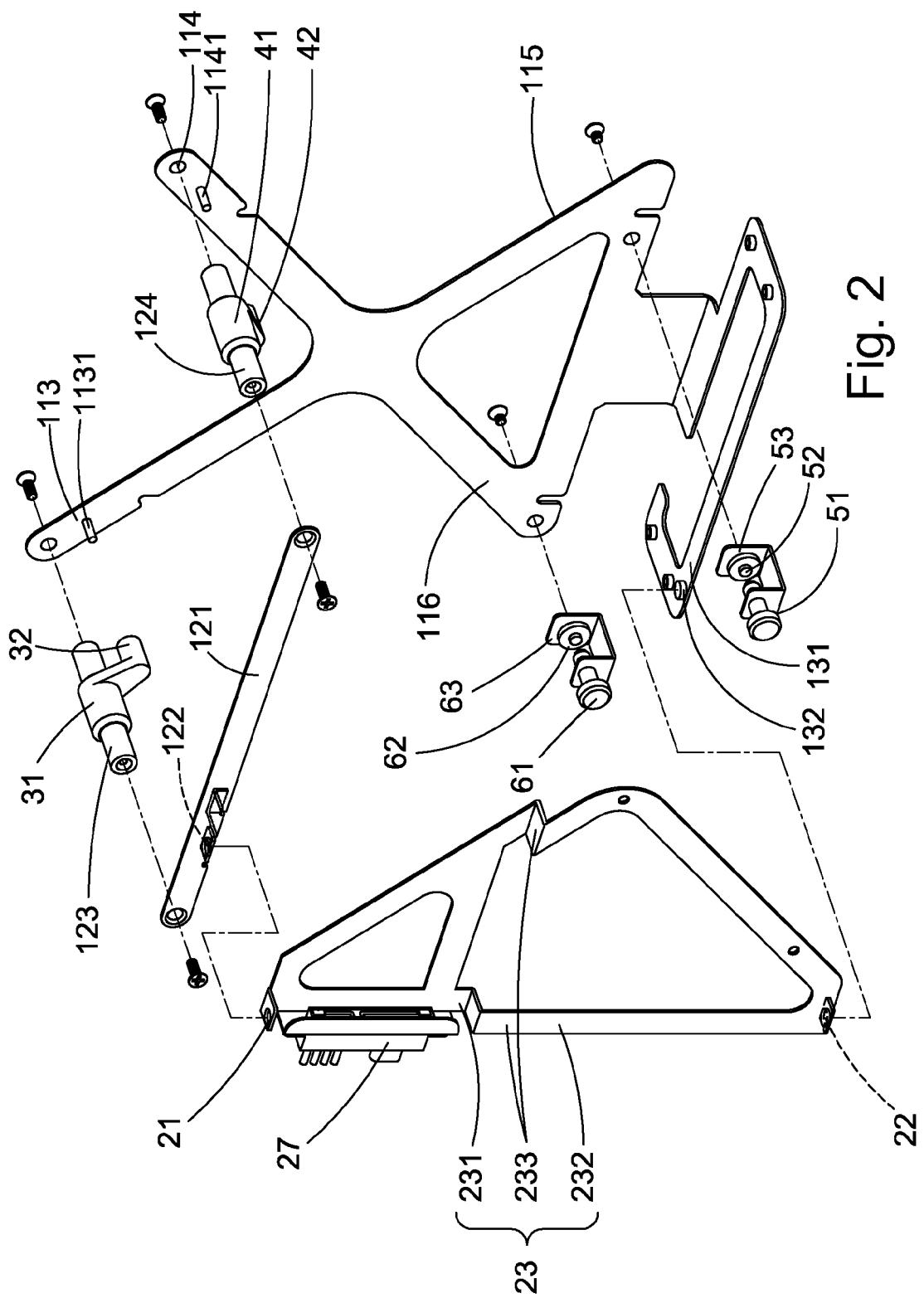
FIG. 2 is an exploded view of the holding frame according to the first embodiment as shown in FIG. 1.

As shown in FIG. 1 and FIG. 2, the supporting portion 11 can be shaped into any desired form. In this embodiment, the supporting portion 11 is X-shaped and includes four ends 113, 114, 115, 116.

The first extending portion 12 includes a connection portion 121, a pivoting member 123, and two tubular members 123, 124. Two holes are respectively formed at two ends of the connection portion 121. The tubular members 123, 124 are vertically fixed to two ends of the connection portion 121 respectively by fixing members (such as bolts or screws). Furthermore, the tubular members 123, 124 are detachably fixed to the two ends 113, 114 of the holding frame 10 via the linkage members 30, 40. In this embodiment, the connection portion 121 is, but not limited to, of planar-shaped. In other example, the connection portion 121 is of tubular-shaped such that the whole first extending portion 12 is configured into tubular shape. The pivoting member 122 is disposed on the side, facing the tubular member 123, of the connection portion 121, and the pivoting member 122 is vertical to the connection portion 121. In this embodiment, the pivoting member 122 is, but not limited to, disposed adjacent to the end 113. The pivoting member 122 can be shaped into any desired form. In this embodiment, the pivoting member is a plate with holes.

The second extending portion 13 includes a connection bottom 131 and a pivoting member 132. The connection bottom 131 can be formed into any desired shape, for example a shape matching the base of a power supply. In this embodiment, the connection bottom 131 is formed into a rectangular rim having a notch. The pivoting member 132 is disposed on the connection bottom 131. The location of the pivoting member 132 is corresponding to the location of the pivoting member 122. The pivoting member 132 can be formed into desired pivoting structure, for example a pivoting structure as that of the pivoting member 122. In this embodiment, the pivoting member 132 is a bolt.

Referring to FIG. 2, the linkage member 30 includes a sleeve 31 and a fixing pillar 32. The sleeve 31 is sleeved on the first extending portion 12. The tubular members 123 inserts into the sleeve 30 and removable disposed to the end 113. The fixing pillar 32 is detachably disposed on the supporting portion 11 via connecting to a protruding part 1131 on the end 113. Through the fixing pillar 32 of the linkage member 30, the linkage member 30 removably fixes a motherboard 9 on the supporting portion 11.

The linkage member 40 includes a sleeve 41 and a fixing pillar 42. The sleeve 41 is sleeved on the first extending portion 12. The tubular members 124 inserts into the sleeve 40 and removable disposed to the end 114. The fixing pillar 42 is detachably disposed on the supporting portion 11 via connecting to a protruding part 1141 on the end 114. Through the fixing pillar 42 of the linkage member 40, the linkage member 40 removably fixes the motherboard 9 on the supporting portion 11.

Referring to FIG. 2, the linkage member 50 is a bolting structure, and includes an inserting part 51, a protruding part 52 and a fixing part 53. The inserting part 51 runs through the fixing part 53 and inserts into the protruding part 52. The inserting part 51 removably fixes the motherboard 9 on the supporting portion 11. The linkage member 50 is disposed to the end 115. A hole is formed on the end 115 and the protruding part 52 runs through the fixing part 53 and the aforementioned hole and then fixed on the end 115 by engaging with a nut.

The other linkage member 60 is also a bolting structure, disposed to the end 116, and includes an inserting part 61, a protruding part 62 and a fixing part 63. The inserting part 61 the same as the inserting part 51. The protruding part 62 the same as the protruding part 52. The fixing part 63 the same as the fixing part 53.

Figure 3:
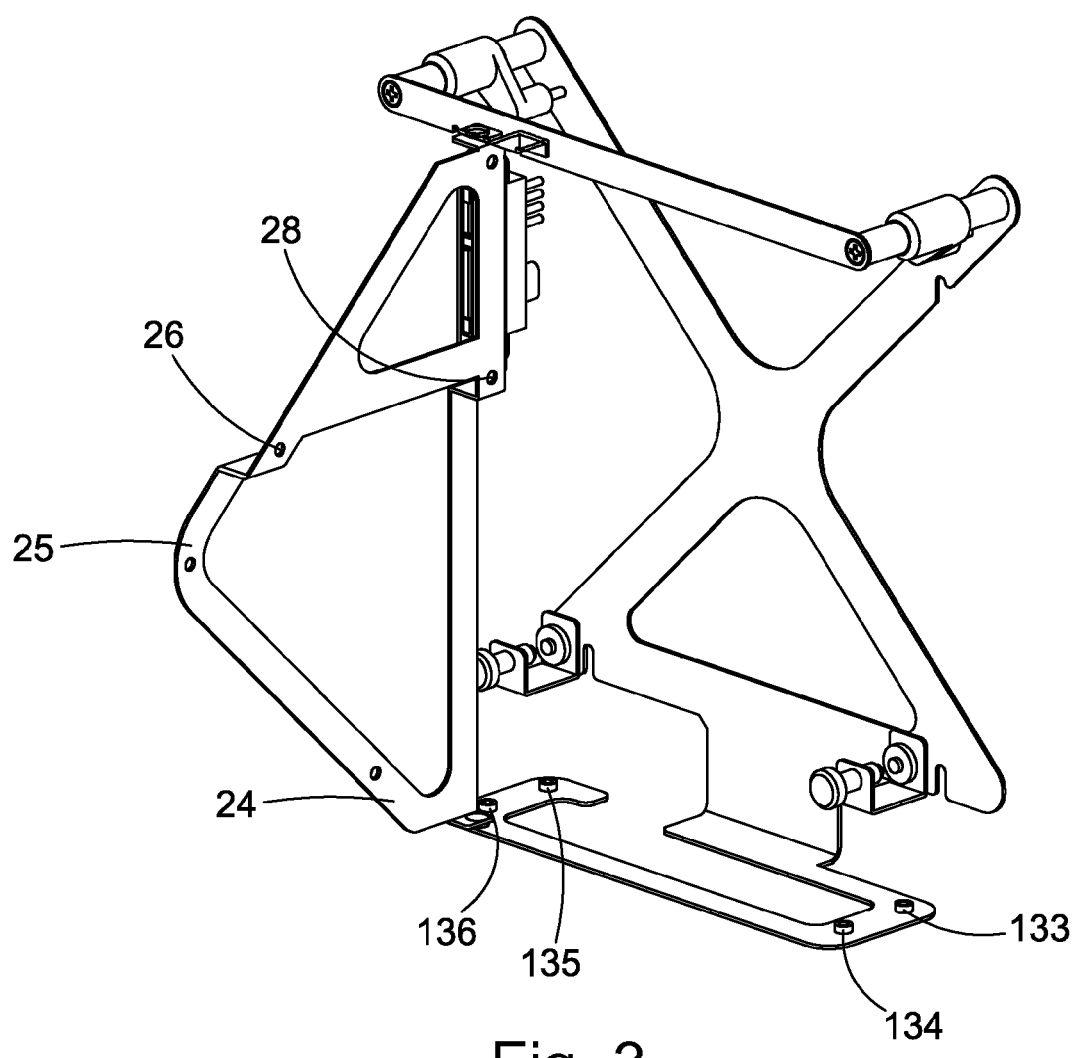
FIG. 3 is a three-dimensional view of the holding frame according to the first embodiment showing the holding frame opened.

Referring to FIG. 1, FIG. 2 and FIG. 3, the rotational holder 20 can be any desired configuration that is able to rotate with respect to the main holder 10 and carry the peripheral device 3 disposed thereon. In this embodiment, the rotational holder 20 includes a first pivoting portion 21 and a second pivoting portion 22. The first pivoting portion 21 is connected to the first extending portion 12 while the second pivoting portion 22 is connected to the second extending portion 13. The rotational holder 20 rotates on the main holder 10 about an axis defined by the first pivoting portion 21 and the second pivoting portion 22.

More specifically, the rotational holder 20 includes a first pivoting portion 21, a second pivoting portion 22, and a holding portion 23. The first pivoting portion 21 and the second pivoting portion 22 are respectively disposed on tow ends of the holding portion 23. The first pivoting portion 21 is pivotally combined with the pivoting member 122 of the first extending portion 12. The second pivoting portion 22 is pivotally combined with the pivoting member 132 of the second extending portion 13. In this embodiment, the first pivoting portion 21 is a plate with holes and perpendicular to the holding portion 23. The first pivoting portion 21 is pivoted to the pivoting member 122 via a bolt inserting into a hole of the pivoting member 122. The second pivoting portion 22 is a plate with holes and perpendicular to the holding portion 23. The second pivoting portion 22 is pivoted to the pivoting member 122 via the combination of a bolt and a nut.

The rotational holder 20 is pivoted to the pivoting member 122 via the first pivoting portion, and is pivoted to the pivoting member 132 via the second pivoting portion 122. Such that the rotational holder 20 is pivoted to the main holder 10, and rotates on the main holder 10 about an axis defined by the first pivoting portion 21 and the second pivoting portion 22. As a result, the rotational holder 20 can rotate to a closed position as shown in FIG. 1 and to an opened position as shown in FIG. 3. A user can easily move the rotational holder 20 to the opened position, so as to install a peripheral device 3, a power module 8 or a motherboard 9 on the rotational holder 20.

Referring to FIG. 2, the rotational holder 20 can be any desired configuration that is able to carry one or more peripheral devices 3 disposed thereon. The rotational holder 20 includes a first holding section 231, a second holding section 232, and a conjunction section 233. The conjunction section connects the first holding section 231 to the second holding section 232. The first holding section 231 is, but not limited to, triangular-shaped. The second holding section 232 is, but not limited to, triangular-shaped symmetric to the first holding section 231.

The conjunction section 233 is bent. Thus, an concave accommodating space is defined within the first holding section 231 an located on an outer side of the rotational holder 20, and another concave accommodating space is defined within the second holding section 232 and located on an inner side of the rotational holder 20. The peripheral device 3 can be disposed in the concave accommodating space of the first holding section 231 or the concave accommodating space of the second holding section 233.

The rotational holder can be configured with more conjunction sections and more holding sections, so as to define more concave accommodating space to receive peripheral devices 3. Through the holding portion 23 of the rotational holder 20, the user can install the peripheral device 3 onto the rotational holder.

When installing the peripheral device 3 to the concave accommodating space of the first holding section 231, the peripheral device is disposed on the outer side of the rotational holder 20 and the rotational holder 20 is not required to be rotate to the opened position for installing or un-installing the peripheral device 3. Compare with fixing the peripheral device 3 to a planar structure via screws, installing the peripheral device 3 in a concave accommodating space can fix peripheral device 3 more firmly.

When the rotational holder 20 rotates to the opened position, the user can install the peripheral device 3 to the concave accommodating space of the second holding section 232.

Supporting bars can be used to replace the bent structure of the conjunction section 233. The supporting bars separate the first holding section 231 and the second holding section 232, and can support the peripheral device 3 disposed in the first holding section 231.

Referring to FIG. 2 and FIG. 3, one or more electrical connectors 27 are disposed on the rotational holder for electrically connecting to peripheral devices. The electrical connector 27 can be, but not limited to, a SATA connector for a hard disk device, which provides hot-plug/hot-swap function for the hard disk device. The rotational holder 20 is equipped with holes for fixing the peripheral device 3 with bolts or screws. Referring to FIG. 2 and FIG. 3, the rotational holder 20 includes plural holes 24, 25, 26, 28. The holes 24, 25 are disposed on the second holding section 232. The holes 26, 28 are disposed on the first holding section 231.

Figure 4:
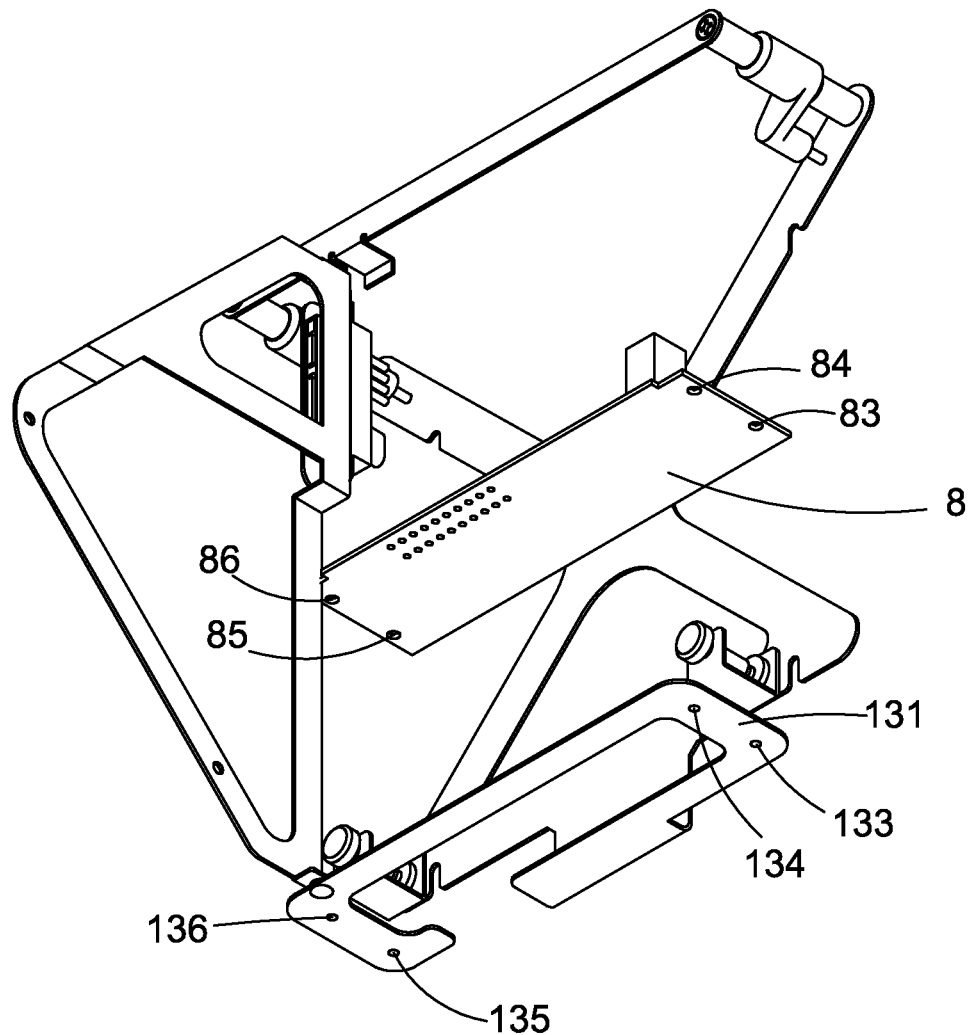
FIG. 4 is a three-dimensional view of the holding frame according to the first embodiment as shown in FIG. 1, showing a power module disposed within the holding frame.
Figure 5:
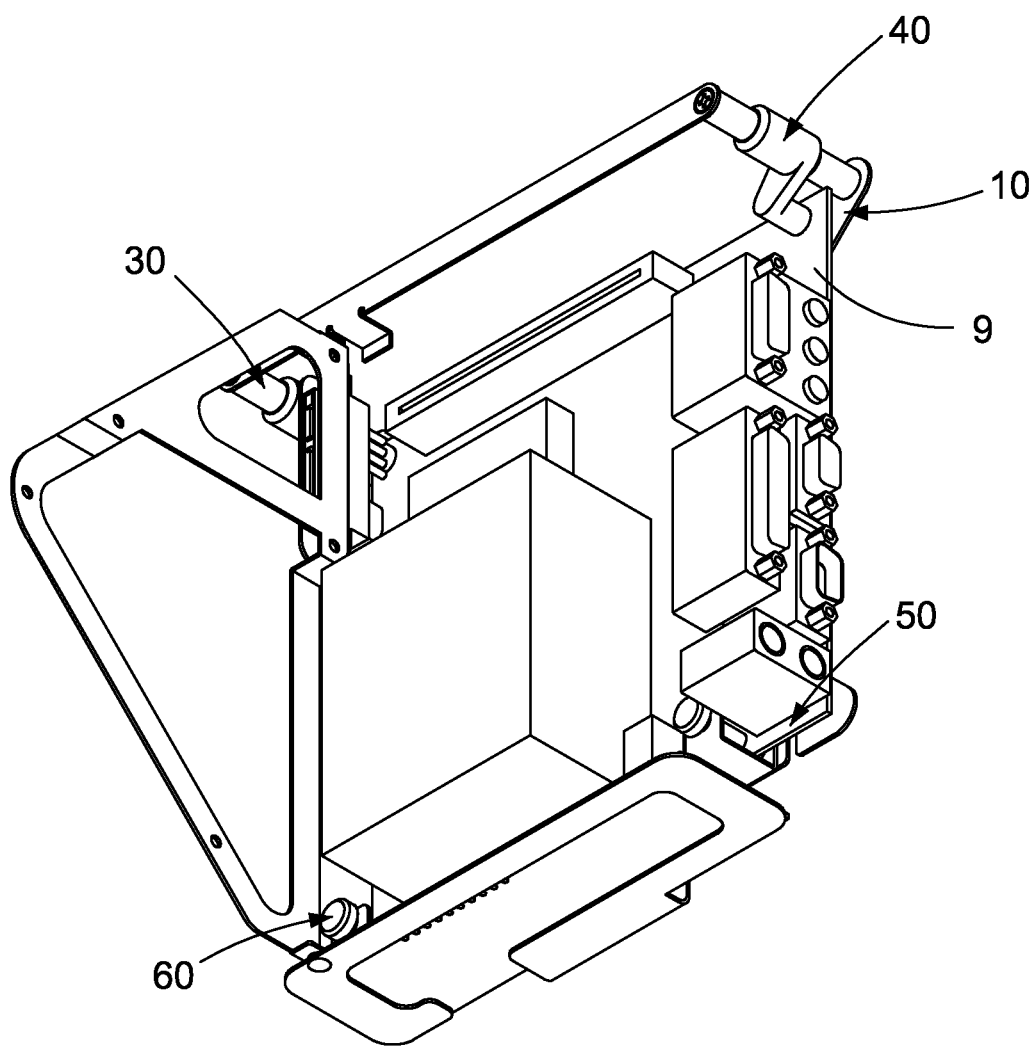
FIG. 5 is a three-dimensional view of the holding frame according to the first embodiment as shown in FIG. 1, showing a motherboard 9 and the power module disposed within the holding frame.

The power module 8, the motherboard 9 and the peripheral device can be disposed on the holding frame 1. Referring to FIG. 4 and FIG. 5, the power module 8 is disposed on the main holder 10 of the holding frame 1.

More specifically, the power module 8 is disposed on the second extending portion 13 of the main holder 10. The second extending portion 13 of the main holder includes plural fixing members 133, 134, 135, 136. The fixing members 133, 134, 135, 136 are disposed on the connection bottom 131. The power module 8 includes plural fixing holes 83, 84, 85, 86 corresponding to the fixing members 133, 134, 135, 136. The fixing members 133, 134, 135, 136 run through the fixing holes 83, 84, 85, 86 of the power module 8 and engage with nuts, so as to fix the power module 8 on the main holder 10.

Figure 6:
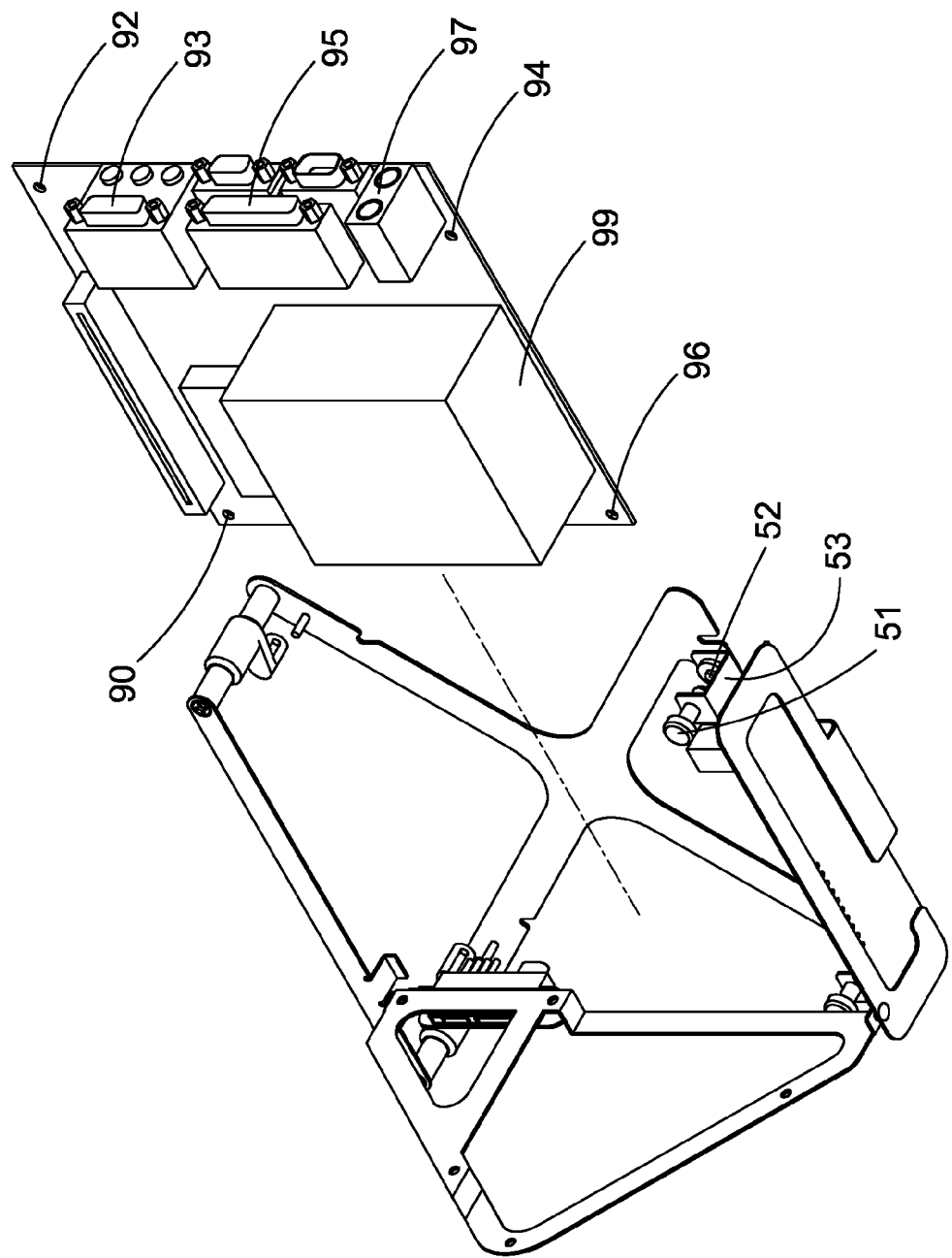
FIG. 6 is an exploded view of the holding frame according to the first embodiment as shown in FIG. 5.

Referring to FIG. 5. The motherboard 9 is mounted onto the main holder 10 via the linkage members 30, 40, 50, 60 of the main holder 10. Referring to FIG. 6, Plural electronic components 93, 95, 97, 99 are disposed on the motherboard 9. The motherboard 9 includes plural fixing holes 90, 92, 94, 96.

Referring to FIG. 2 and FIG. 6, the fixing pillar 32 of the linkage member 30 inserts into the fixing hole 90 engages the supporting portion 11. The fixing pillar 42 of the linkage member 40 inserts into the fixing hole 92 engages the supporting portion 11. Through the fixing pillars 32, 42, the motherboard 9 is fixed on the supporting portion 11. The inserting part 51 of the linkage member 50 inserts into the fixing hole 94 of the motherboard 9 and engages with the protruding part 52. The inserting part 61 of the linkage member 60 inserts into the fixing hole 96 of the motherboard 9 and engages with the protruding part 62. Through the inserting parts 51, 61, the motherboard 9 is fixed on the supporting portion 11.

The holding frame 1 can be removable from the case body, such that the user can easily install or un-install the motherboard 9 when the holding frame 1 is removed from the case body.

Figure 7:
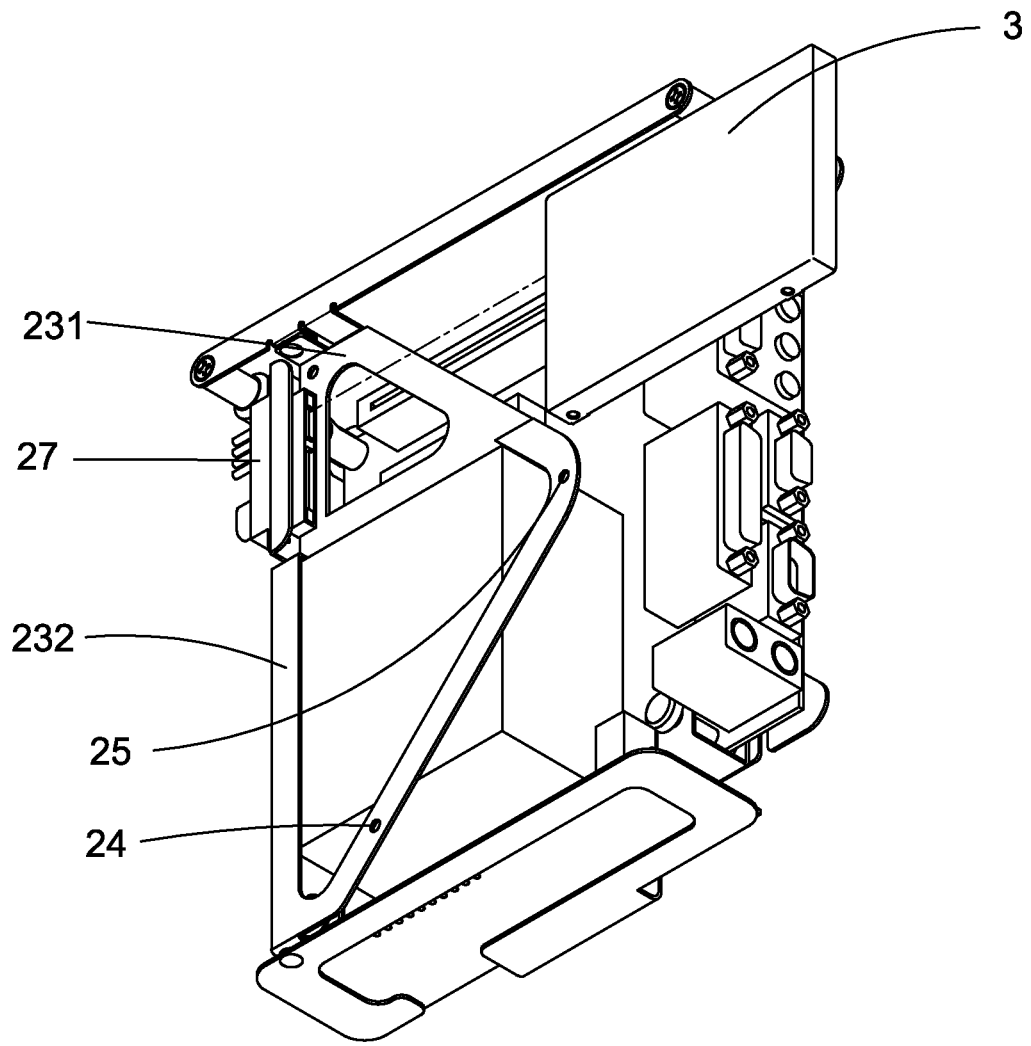
FIG. 7 is a three-dimensional view of the holding frame according to the first embodiment showing a peripheral device disposed within the holding frame.
Figure 8:
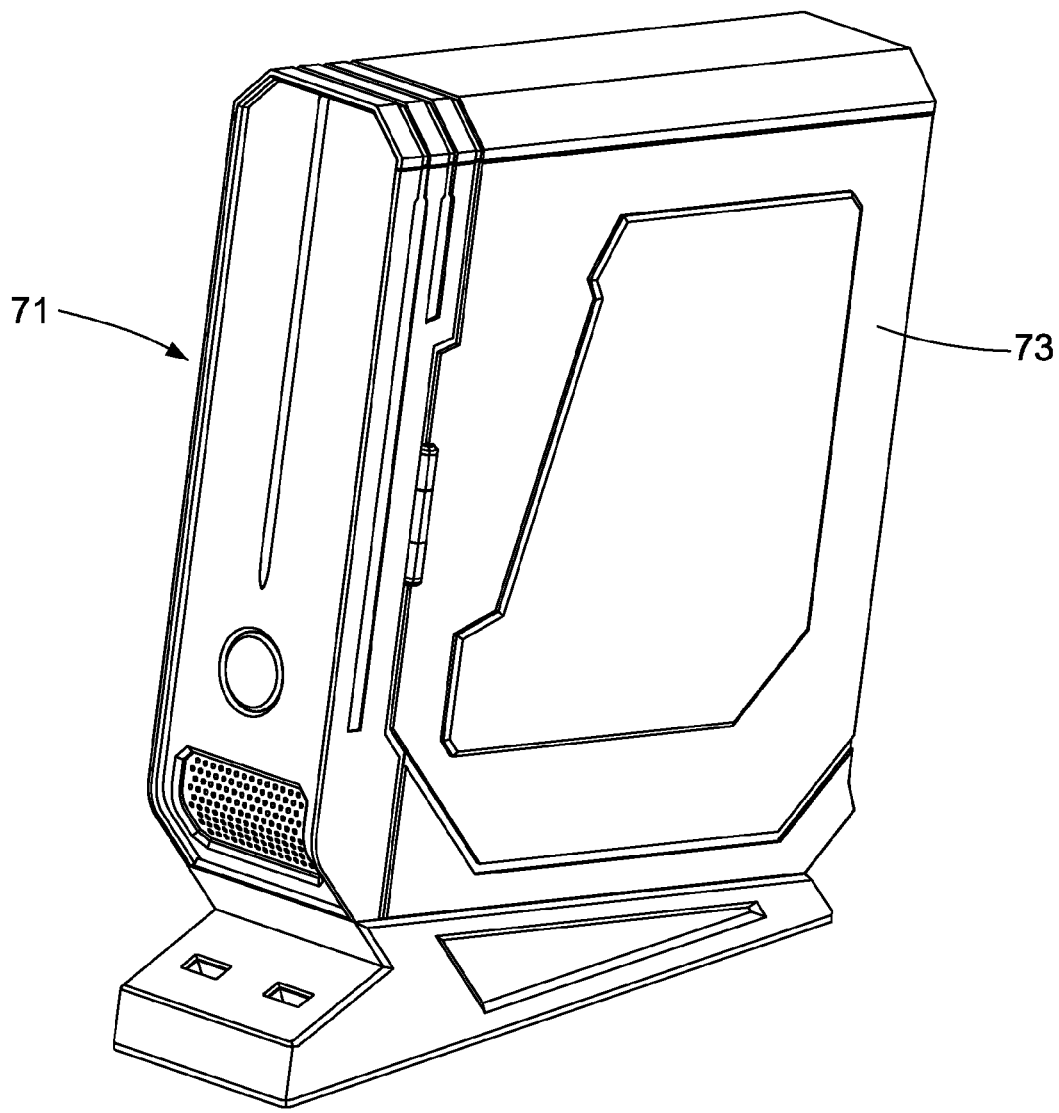
FIG. 8 is a three-dimensional view of a case body with a holding frame disposed therein according to the first embodiment.
Figure 9:
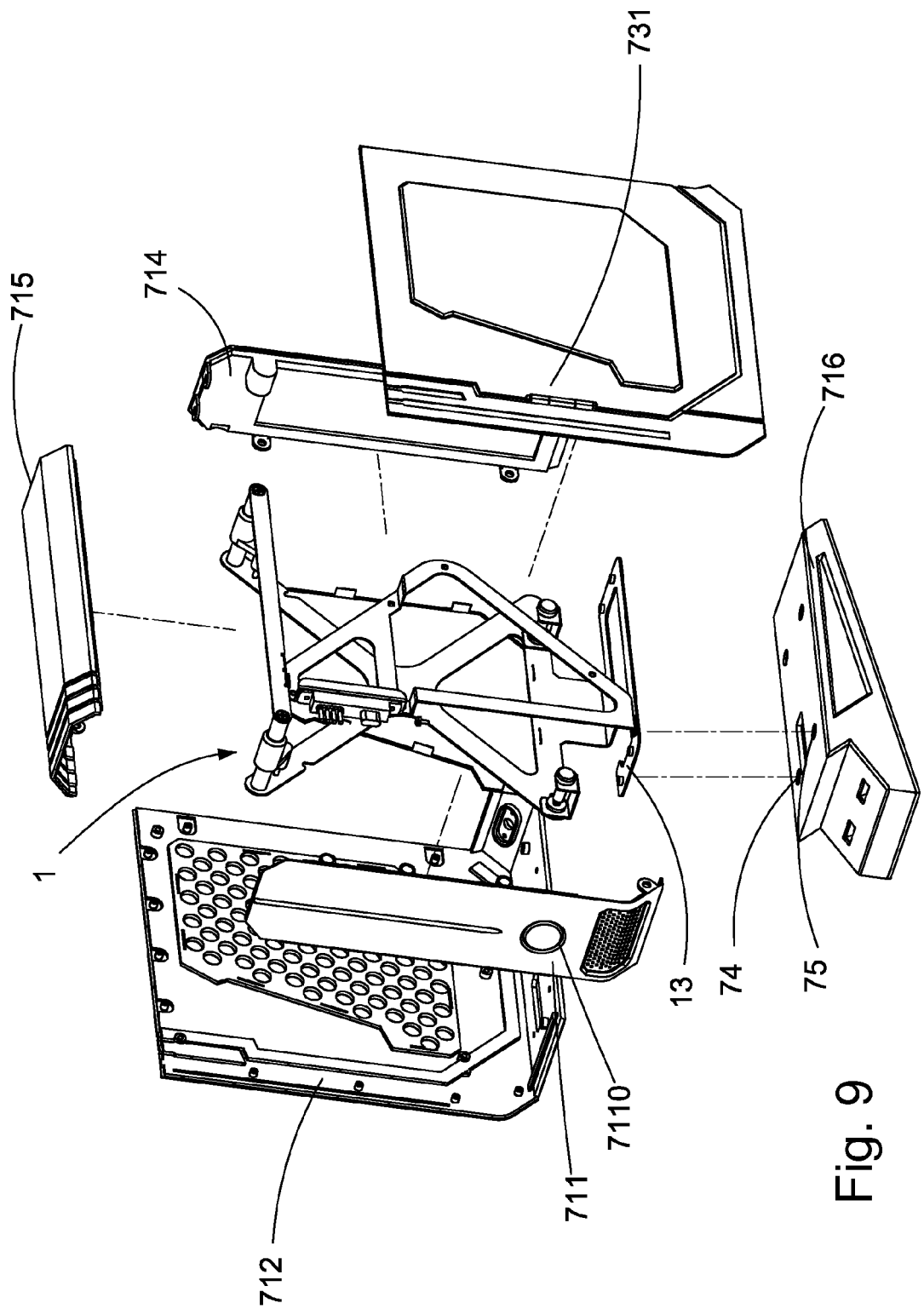
FIG. 9 is an exploded view of the case body according to the first embodiment as shown in FIG. 8.

Referring to FIG. 7, the peripheral device 3 is mounted onto the rotational holder 20. And the peripheral device 3 is electrically connected to the motherboard 9 via a cable. More specifically, the peripheral device 3 is installed in the concave accommodating space of the first holding section 231 or the second holding section 232 of the rotational holder 20, and the peripheral device 3 is connected to the electrical connector 27 to be fixed on the rotational holder 20. As shown in FIG. 8 and FIG. 9, the housing assembly includes a case body and the holding frame 1.

The case body includes a base 71 and a lateral plate 73. An internal space is defined by the base 71 and lateral plate 73. Referring to FIG. 9, the base 71 includes a front bezel 711, a lateral bezel 714, back bezel 714, a top plate 715 and a base plate 716. Buttons 7110 are disposed on the front bezel 711. The back bezel 714 is disposed opposite to the front bezel 711. The lateral plate 73 has structure similar to that of the lateral bezel 712, and is disposed opposite to the lateral bezel 712. The front bezel 711, the back bezel 714, the lateral bezel 712, or the lateral plate 73 is perpendicular to the base plate 716. The top plate 715 is disposed above the base plate 716.

The holding frame 1 is disposed within the case body 70. Referring to FIG. 9, the case body 70 includes plural protruding parts 74, 75. The protruding parts 74, 75 are disposed on the base plate 716 for inserting to the holes of the bottom-plate 13 of the holding frame 1. Furthermore, the tubular members 123, 124 of the first extending portion 12 of the holding frame 1 also mate the protruding parts 74, 75 of the case body 70. Through the protruding parts 74, 75, the holding frame 1 is fixed within the case body 70.

Referring to FIG. 7, the case body 70 includes a hinge 731. The hinge 731 connects the lateral plate 73 to the base 71, such that the lateral plate 73 is able to rotate on the base 71, and the user can pull or push the lateral plate 73 to open or close the case body 70.

Through the holding frame 1 and the case body 70, the user can remove the holding frame 1 from the case body 70, install required parts on the holding frame 1, and then install the holding frame 1 with these parts into the case body 70.

Figure 10:
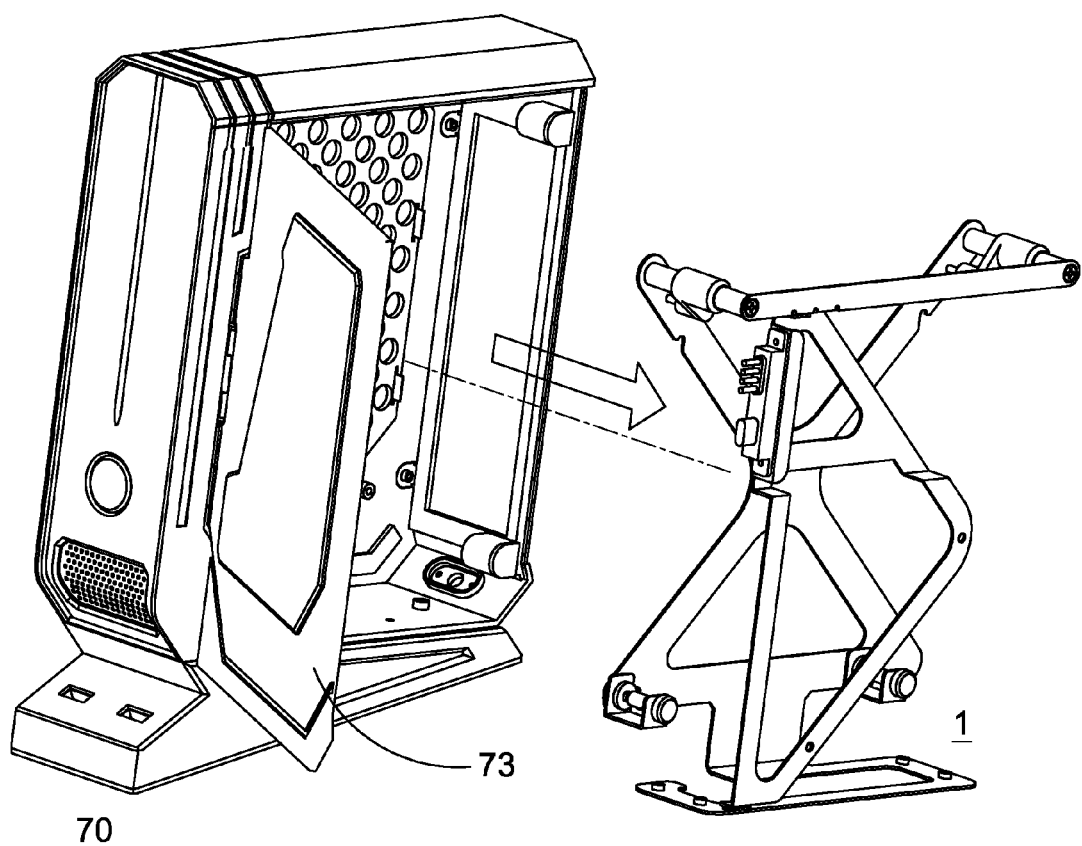
FIG. 10 is a three-dimensional view showing the holding frame detached from the case body according to the first embodiment.

Referring to FIG. 10, the user can pull and rotate the lateral plate 73 to an opened state, and remove the holding frame 1 from the case body 70.

Figure 11:
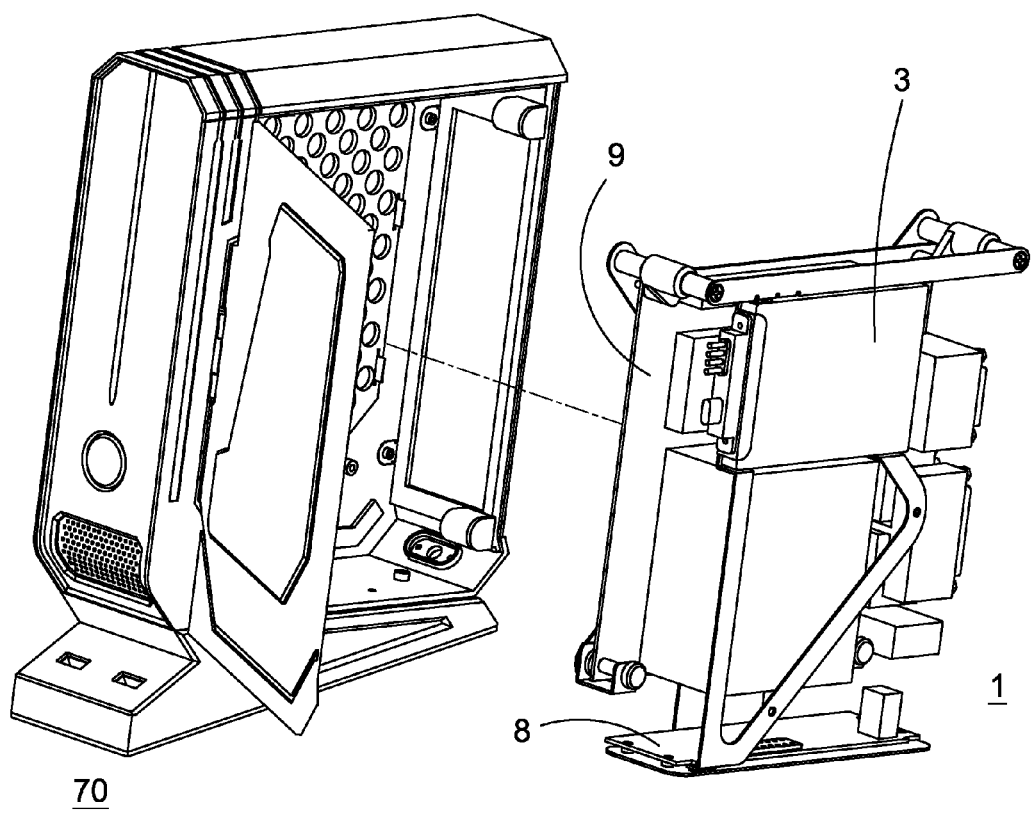
FIG. 11 is a three-dimensional view showing the holding frame having computer parts mounted thereon and located outside the case body.
Figure 12:
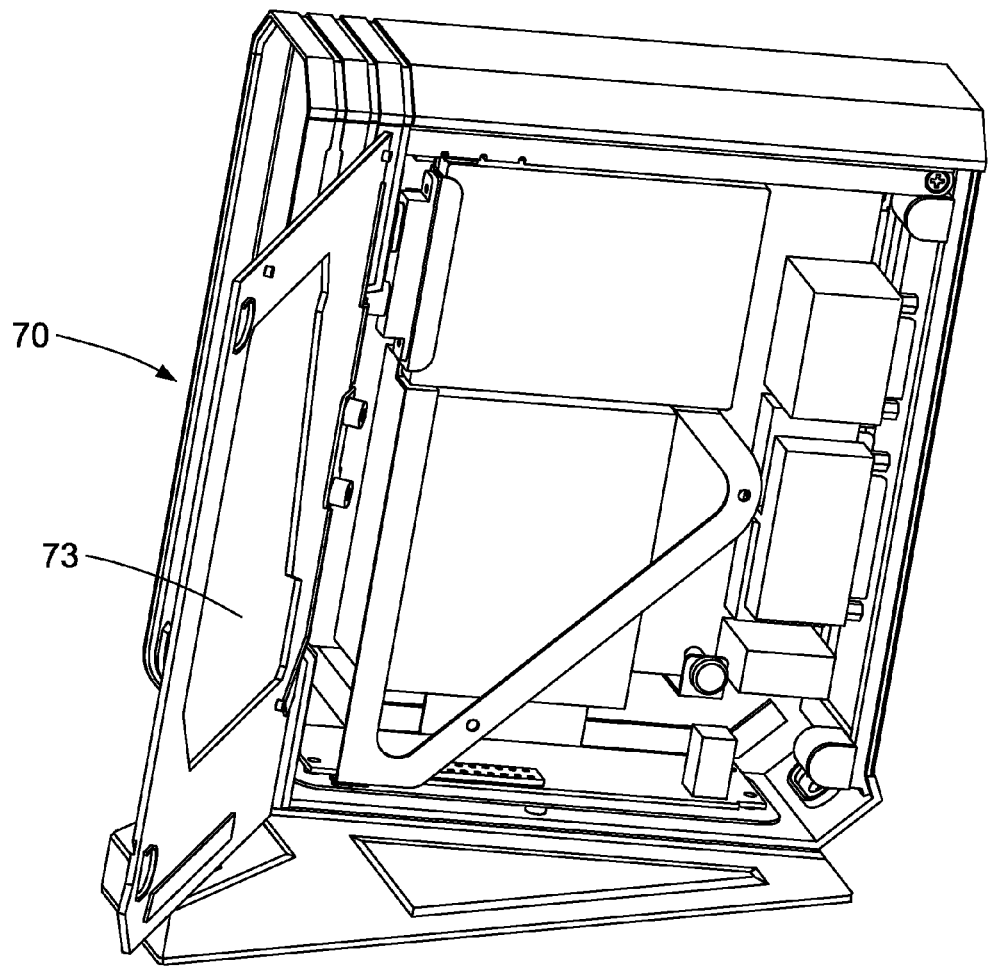
FIG. 12 is a three-dimensional view showing the holding frame having computer parts mounted thereon and disposed within the case body.

Then, the user can install the power module 8, the motherboard 9, and the peripheral device 3 on the holding frame 1 as shown in FIG. 4 to FIG. 7. Referring to FIG. 11, then the user install the holding frame 1 with the power module 8, the motherboard 9, and the peripheral device 3 into the case body 70. Referring to FIG. 1, FIG. 9, and FIG. 12, through the protruding parts 74, 75 of the case body 70 with the holding frame 1, the frame 1 is fixed in the case body 70. Finally, after the user pushes the lateral plate 73 to a closed state, the installation of the computer is completed. Through this disclosure, the installation of mounting the motherboard 9 and the peripheral device 3 onto the holding frame 1 can be performed outside the case body 70 without being interfered by the case body 70.

Figure 13:
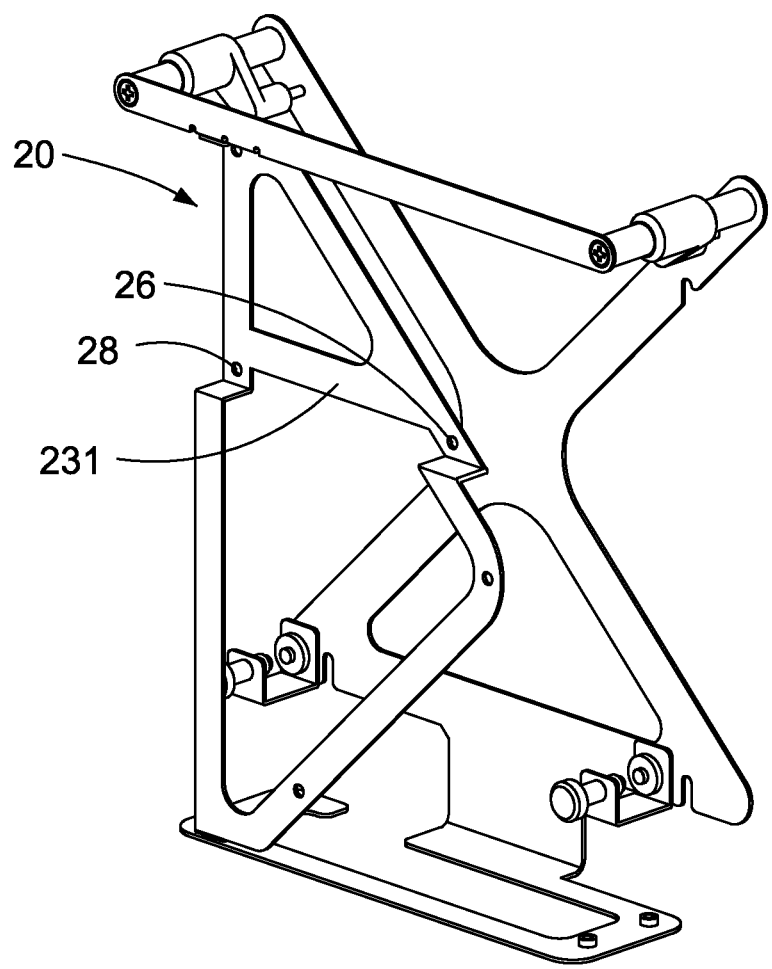
FIG. 13 is a three-dimensional view of a holding frame according to a second embodiment.
Figure 14:
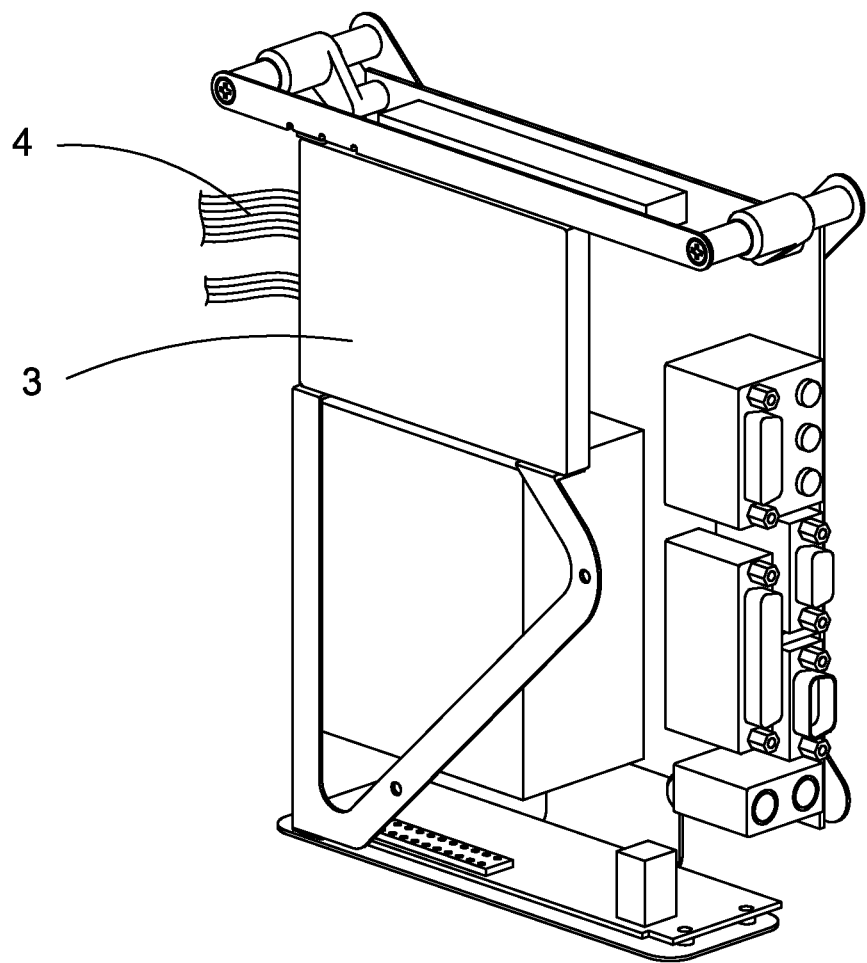
FIG. 14 is a three-dimensional view of the holding frame according to the first embodiment as shown in FIG. 13, showing a peripheral device disposed within the holding frame.

Referring to FIG. 13 and FIG. 14, in which a second embodiment is shown.

In the second embodiment, the rotational holder 20 is not equipped with the electrical connector 27 as shown in FIG. 2. Plural fixing holes 26, 28 are disposed on the first holding section 231 of the rotational holder 20. Referring to FIG. 14, the peripheral device 3 is mounted onto the rotational holder 20 via bolts or screws running through the fixing holes 26, 28. The peripheral device 3 is equipped with a cable 4 electrically connecting to the motherboard 9.

Through the linkage members, the user can easily install or un-install the motherboard 9 when the holding frame 1 is removed from the case body 70. By the rotational movement of the rotational holder 20, the holding frame 1 for mounting the computer parts (such as the motherboard 9 or peripheral device 3) will not interfere with the installation of these computer parts. This disclosure further includes the following advantages.

First, in the examples that the rotational holder 20 includes plural holes, the peripheral device 3 can be easily mounted onto the rotational holder 20 via bolts or screws running through the holes.

Second, in the examples that the rotational holder 20 includes concave accommodating space, the peripheral device 3 can be received and firmly fixed within the concave accommodating space. And the concave accommodating space can reduces the weight load applied on the electrical connector or the fixing parts (bolts or screws).

Third, through the rotatable lateral plate of the case body, the user can easily remove the holding frame 1 from the case body 70. Therefore, the installation of the computer parts will not interfered by the case body 70 as the holding frame 1 removed outside the case body 70.

Fourth, since the rotational holder 20 can rotate on the holding frame 1 and the lateral plate can rotate to an opened state, the peripheral device 3 can be mounted onto the rotational holder 20 without detaching the holding frame 1.

What is claimed is:

1. A holding frame, for holding a motherboard, comprising:
    a main holder, for holding the motherboard;
    a rotational holder, pivoted to the main holder to rotate on the holder; wherein the rotational holder includes a first pivoting portion, a second pivoting portion, and a holding portion, the first pivoting portion and the second pivoting portion are respectively connected to two ends of the holding portion, the first pivoting portion and the second pivoting portion are respectively pivoted to the main holder to rotate on the main holder; and
    a linkage member, detachably disposed on the main holder, for mounting the motherboard onto the main holder.

2. The holding frame as claimed in claim 1, wherein the main holder includes a supporting portion, a first extending portion, and a second extending portion; the first extending portion and the second extending portion are respectively disposed on two opposite edges of the supporting portion in a protruding manner, the linkage member is detachably disposed to the first extending portion or the supporting portion.

3. The holding frame as claimed in claim 2, wherein the linkage member includes a sleeve and a fixing pillar, the sleeve is movably sleeved on the first extending portion, and the fixing pillar is detachably disposed on the supporting portion.

4. The holding frame as claimed in claim 2, wherein the linkage member is a bolting structure, detachably disposed on the supporting portion.

5. The holding frame as claimed in claim 2, wherein the main holder further includes a plurality of fixing members, disposed on the second extending portion and for mounting a power module.

6. The holding frame as claimed in claim 1, wherein:
   the holding portion includes a first holding section, a second holding section, and a conjunction section; and
   the conjunction section connects the first holding section to the second holding section and is bent,
   such that the conjunction section and the first holding section define a first concave accommodating space, the first concave accommodating space is located on an outer side of the rotational holder, the conjunction section and the second holding section define a second concave accommodating space, and the second concave accommodating space is located on an inner side of the rotational holder.

7. The holding frame as claimed in claim 1, further comprising an electrical connector, disposed on one side of the holding portion.

8. The holding frame as claimed in claim 1, wherein the rotational holder further includes a plurality of through holes disposed on the holding portion.

9. A housing assembly, comprising:
   a case body; and
   a holding frame, disposed within the case body, for holding a motherboard, and the holding frame comprising:
      a main holder, for holding the motherboard;
      a rotational holder, pivoted to the main holder to rotate on the holder; wherein the rotational holder includes a first pivoting portion, a second pivoting portion, and a holding portion, the first pivoting portion and the second pivoting portion are respectively connected to two ends of the holding portion, the first pivoting portion and the second pivoting portion are respectively pivoted to the main holder to rotate on the main holder; and
      a linkage member, detachably disposed on the main holder, for mounting the motherboard onto the main holder.

10. The housing assembly as claimed in claim 9, wherein the case body includes a lateral plate, a base, and a hinge; the hinge is disposed at one edge of the lateral plate, and the lateral plate is pivoted to the base via the hinge to rotate on the base.

11. The housing assembly as claimed in claim 9, wherein the main holder includes a supporting portion, a first extending portion, and a second extending portion; the first extending portion and the second extending portion are respectively disposed on two opposite edges of the supporting portion in a protruding manner, and the linkage member is detachably disposed to first extending portion or the supporting portion.

12. The housing assembly as claimed in claim 11, wherein the linkage member includes a sleeve and a fixing pillar, the sleeve is movably sleeved on the first extending portion, and the fixing pillar is detachably disposed on the supporting portion.

13. The housing assembly as claimed in claim 11, wherein the linkage member is a bolting structure, detachably disposed on the supporting portion.

14. The housing assembly as claimed in claim 11, wherein the main holder further includes a plurality of fixing members, disposed on the second extending portion for mounting a power module.

15. The housing assembly as claimed in claim 9, wherein:
   the holding portion includes a first holding section, a second holding section, and a conjunction section; and
   the conjunction section connects the first holding section to the second holding section and is bent, such that the conjunction section and the first holding section define a first concave accommodating space, the first concave accommodating space is located on an outer side of the rotational holder, the conjunction section and the second holding section define a second concave accommodating space, and the second concave accommodating space is located on an inner side of the rotational holder.

16. The housing assembly as claimed in claim 9, wherein the holding frame further comprises an electrical connector, disposed on one side of the holding portion.

17. The housing assembly as claimed in claim 9, wherein the rotational holder further includes a plurality of through holes disposed on the holding portion.

* * * * *